United States Patent
Nelson

(10) Patent No.: US 6,838,058 B2
(45) Date of Patent: Jan. 4, 2005

(54) STRUCTURAL CARRIER NON-THERMAL PLASMA REACTOR

(75) Inventor: David Emil Nelson, Independence Township, MI (US)

(73) Assignee: Delphi Technologies, Inc., Troy, MI (US)

(*) Notice: Subject to any disclaimer, the term of this patent is extended or adjusted under 35 U.S.C. 154(b) by 99 days.

(21) Appl. No.: 09/740,575

(22) Filed: Dec. 18, 2000

(65) Prior Publication Data

US 2004/0069411 A1 Apr. 15, 2004

(51) Int. Cl.[7] ............................................. B01J 19/08
(52) U.S. Cl. ................................................ 422/186.04
(58) Field of Search ....................... 422/186.04, 186.07

(56) References Cited

U.S. PATENT DOCUMENTS

| | | | | |
|---|---|---|---|---|
| 2,744,865 A | * | 5/1956 | Penning | 422/186.07 |
| 5,411,713 A | * | 5/1995 | Iwanaga | 422/186.07 |
| 5,417,936 A | * | 5/1995 | Suzuki et al. | 422/186.07 |
| 6,106,788 A | * | 8/2000 | Rau et al. | 422/186.07 |
| 6,119,455 A | * | 9/2000 | Hammer et al. | 422/186.04 |
| 6,368,451 B1 | | 4/2002 | Goulette et al. | |
| 6,423,190 B2 | | 7/2002 | Hemingway et al. | |
| 6,482,368 B2 | | 11/2002 | Hemingway et al. | |

* cited by examiner

Primary Examiner—Kishor Mayekar
(74) Attorney, Agent, or Firm—Paul L. Marshall

(57) ABSTRACT

A non-thermal plasma reactor element includes a structural carrier; a thin electrode layer disposed upon the structural carrier; and a thin high k barrier layer disposed upon the electrode layer. Double, single and null dielectric carrier elements are provided. The structural support function for the element is substantially provided by the structural carrier while the dielectric barrier function is substantially provided by the high k barrier layer. This enables optimum utilization of conventional extrusion materials having low-cost, fabricability, mechanical and thermal properties (such as cordierite, mullite, and alumina) as structural carriers. Electrode layers and high k barrier layers are tailored to have dimensions as thin as possible for the particular NTP reactor application. In a preferred embodiment, a minimal number of structural ligaments are provided, thereby maximizing conversion efficiency while maintaining structural and electrical performance.

23 Claims, 6 Drawing Sheets

DETAIL X

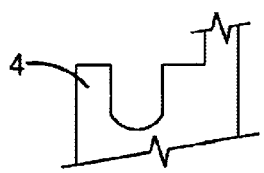
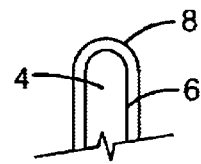
FIG. 12
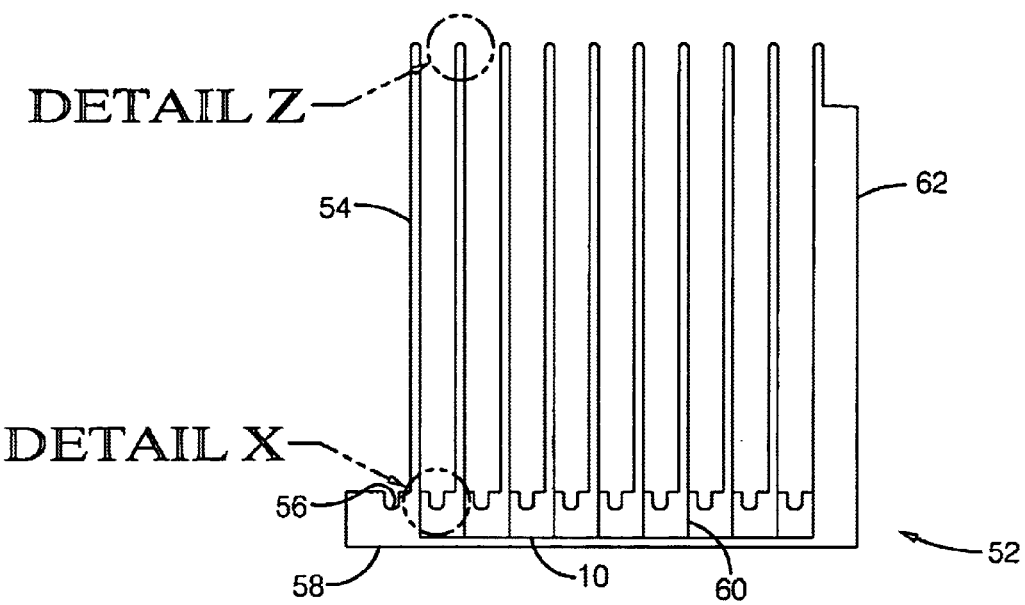
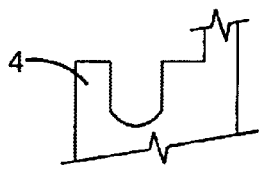
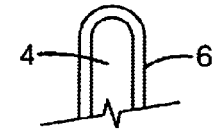
FIG. 13
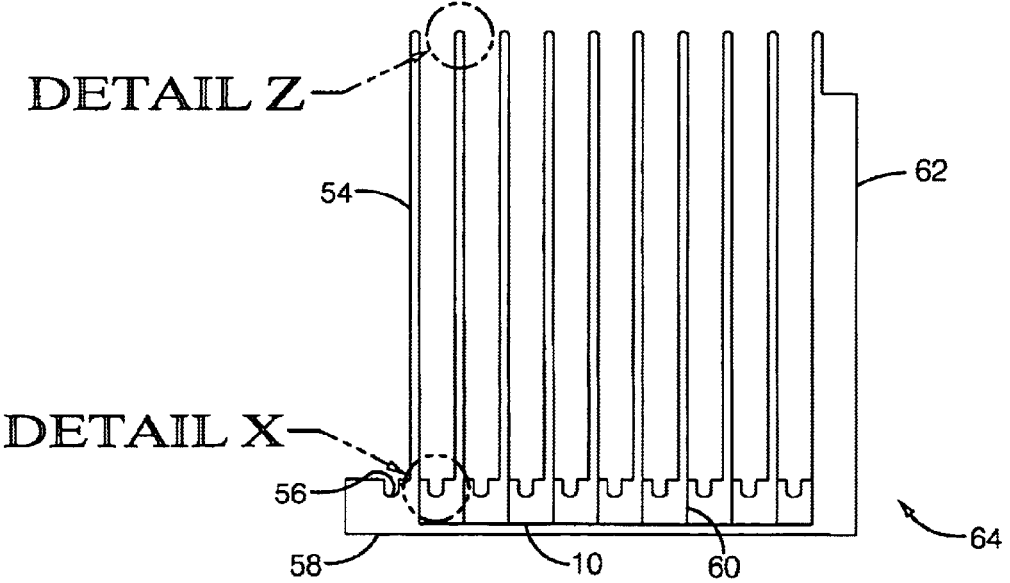

STRUCTURAL CARRIER NON-THERMAL PLASMA REACTOR

TECHNICAL FIELD

The present invention relates to apparatus for reducing regulated emissions from the exhaust streams of combustion processes and more particularly relates to a non-thermal plasma reactor exhaust treatment apparatus.

BACKGROUND OF THE INVENTION

Certain compounds in the exhaust stream of a combustion process, such as the exhaust stream from an internal combustion engine, are undesirable in that they must be controlled in order to meet government emissions regulations. Among the regulated compounds are hydrocarbons, soot particulates, and nitrogen oxide compounds (NOx). There are a wide variety of combustion processes producing these emissions, for instance, coal-or oil-fired furnaces, reciprocating internal combustion engines (including gasoline spark ignition and diesel engines), gas turbine engines, and so on. In each of these combustion processes, control measures to prevent or diminish atmospheric emissions of these emissions are needed.

Industry has devoted considerable effort to reducing regulated emissions from the exhaust streams of combustion processes. In particular, it is now usual in the automotive industry to place a catalytic converter in the exhaust system of gasoline spark ignition engines to remove undesirable emissions from the exhaust by chemical treatment. Typically, a "three-way" catalyst system of platinum, palladium, and rhodium metals dispersed on an oxide support is used to oxidize carbon monoxide and hydrocarbons to water and carbon dioxide and to reduce nitrogen oxides to nitrogen The catalyst system is applied to a ceramic substrate such as beads, pellets, or a monolith. When used, beads are usually porous, ceramic spheres having the catalyst metals impregnated in an outer shell. The beads or pellets are of a suitable size and number in the catalytic converter in order to place an aggregate surface area in contact with the exhaust stream that is sufficient to treat the compounds of interest. When a monolith is used, it is usually a cordierite honeycomb monolith and may be pre-coated with gamma-alumina and other specialty oxide materials to provide a durable, high surface area support phase for catalyst deposition. The honeycomb shape, used with the parallel channels running in the direction of the flow of the exhaust stream, both increases the surface area exposed to the exhaust stream and allows the exhaust stream to pass through the catalytic converter without creating undue back pressure that would interfere with operation of the engine.

When a spark ignition engine is operating under stoichiometric conditions or nearly stoichiometric conditions with respect to the fuel-air ratio (just enough oxygen to completely combust the fuel, or perhaps up to 0.3% excess oxygen), a "three-way" catalyst has proven satisfactory for reducing emissions. Unburned fuel (hydrocarbons) and oxygen are consumed in the catalytic converter, and the relatively small amount of excess oxygen does not interfere with the intended operation of the conventional catalyst system.

However, it is desirable to operate the engine at times under lean burn conditions, with excess air, in order to improve fuel economy. Under lean burn conditions, conventional catalytic devices are not very effective for treating the NOx in the resulting oxygen-rich exhaust stream.

The exhaust stream from a diesel engine also has a substantial oxygen content, from perhaps about 2–18% oxygen, and, in addition, contains a significant amount of particulate emissions. The particulate emissions, or soot, are thought to be primarily carbonaceous particles. It is also believed that other combustion processes result in emissions that are difficult or expensive to control because of, for instance, dilute concentrations of the compounds to be removed from the effluent stream or poor conversion of the compounds using conventional means.

In spite of efforts over the last decade to develop an effective means for reducing NOx to nitrogen under oxidizing conditions in a spark ignition gasoline engine or in an diesel engine, the need for improved conversion effectiveness has remained unsatisfied. Moreover, there is a continuing need for improved effectiveness in treating emissions from any combustion process, particularly for treating the soot particulate emissions from diesel engines.

An alternative way to treat the hydrocarbon, particulate, or NOx emissions in an exhaust or effluent stream would be to destroy such emissions using a non-thermal plasma. Plasma is regarded as the fourth state of matter (ionized state of matter). Unlike thermal plasmas, non-thermal plasmas (NTPs) are in gaseous media at near-ambient temperature and pressure but have electron mean energies considerably higher than other gaseous species in the ambient environment. NTP species include electrically neutral gas molecules, charged particles in the form of positive ions, negative ions, free radicals and electrons, and quanta of electromagnetic radiation (photons). These NTP species are highly reactive and can convert hazardous gases to non-hazardous or less hazardous and easily managed compounds through various chemical reaction mechanisms. In contrast to thermal processes (such as thermal plasma), an NTP process directs electrical energy to induce favorable gas chemical reactions, rather than using the energy to heat the gas. Therefore, NTP is much more energy-efficient than thermal plasma.

NTPs call be generated by electric discharge in the gas or injection of electrons into the gas by an electron beam. Electron beams must be accelerated under a high vacuum and then transferred through special windows to the reaction site. The reaction site must be sized with respect to the penetration depth of the electrons. It is much more difficult to scale-up the size of an electron beam reactor than an electric discharge reactor. Therefore, electron beam reactors are less favored than electric discharge reactors.

Among the various types of electric discharge reactors, pulse corona and dielectric barrier (silent) discharge reactors are very popular for their effectiveness and efficiency. However, pulse corona reactors have the major disadvantage of requiring special pulsed power supplies to initiate and terminate the pulsed corona. Consequently, dielectric barrier discharge has become a fast growing technology for pollution control.

Cylindrical and planar reactors are two common configurations for dielectric barrier discharge reactors. Both of these configurations are characterized by the presence of one or more insulating layers in a current path between two metal electrodes, in addition to the discharge space. Other dielectric barrier discharge reactors include packed-bed discharge reactors, glow discharge reactors, and surface discharge reactors.

A variety of known dielectric barrier discharge NTP reactor designs are based upon the use of one or more structural dielectric ceramic pieces coated with a conductive material arranged to form the dielectric barrier-conductor-dielectric barrier configurations. Problematically, structural ceramic substrates provide relatively poor dimensional control with respect to thickness and camber. For example, dimensional thickness and camber of ceramic substrates may vary by, for example, about +/−10% and +/−0.4%, respectively, resulting in variations in dielectric barrier thickness and gaps. This dimensional variation limits the practical operating range for the non-thermal plasma reactor in applications such as after-treatment of diesel exhaust emissions.

Further, structural ceramics comprise a significant portion of the cost factor for current NTP reactor designs based on structural ceramics having dual support and operational dielectric barrier function. In addition, ceramic materials typically used for such applications, including cordierite, mullite, and alumina, have mid-level dielectric constants, limiting the ability to reduce the overall size of the NTP reactor.

Commonly assigned copending U.S. Patent Application Ser. No. 09/812,071 entitled "Non-Thermal Plasma Reactor And Method—Structural Conductor", which is hereby incorporated by reference herein in its entirety, provides double, single, or null dielectric barrier non-thermal plasma reactor structural conductor elements comprising a structural base conductor. Mechanical strength and durability are provided from one or multiple layers of structural base conductor. For double dielectric structural conductor elements, die base conductor is coated with a high-k dielectric barrier. For null dielectric structural conductor elements, the base conductor is uncoated. For single dielectric structural conductor elements, each exhaust passage has one side coated with high-k dielectric and the other side uncoated.

Uncoated structural conductor reactor elements are most simple to fabricate. However, these require the use of ultra fast (nano-second scale) switching power supplies that are not economical to produce. More typically, the base structural conductor layers are coated with a high-k dielectric so more economical power supplies may be used. It is difficult to achieve a defect-free, durable layer of high-k dielectric over a structural metallic layer for applications having a wide variation in operating temperature, such as for automotive exhaust applications.

What is needed in the art is an improved high capacitance NTP reactor element. What is further needed in the art is an improved high capacitance NTP reactor element that can be manufactured cost effectively while meeting application performance and durability requirements

SUMMARY OF THE INVENTION

The present invention comprises a non-thermal plasma reactor element including a structural carrier having a conductive layer disposed upon the structural carrier. A thin high dielectric constant ("high k") barrier layer is disposed upon the conductive layer to form the non-thermal plasma reactor element. In the reactor element of the present invention, structural support function is substantially provided by the structural carrier; and dielectric barrier function is substantially provided by the high k barrier layer.

Double dielectric, single dielectric, and null dielectric barrier designs are provided based upon structural carrier construction. Uncoated base structural conductor layers are used for null dielectric barrier designs. High k coated base structural conductor layers are used for double dielectric barrier designs. Single dielectric barrier designs are accomplished using alternating dielectric and structural conducting layers.

Conductive layers and high k barriers layer are tailored to have dimensions as thin as possible for the particular NTP reactor application. Using a thin (about 0.02 mm thick) conductive layer that can withstand current flow extremes, it is possible to reduce the stress between the conductive layer and the structural carrier for good durability in extreme temperature environments at minimum cost. By reducing the high k dielectric barrier to the minimum level that can withstand dielectric breakdown (for example, about 0.25 mm thick for alumina), reactor capacitance increases, and reactor size is minimized at low cost.

In an alternate embodiment, an intermediate bonding layer is disposed between the structural support and the conductive layer to increase bonding of the conductive layer to the structural support.

Advantageously, since the structural carrier of the present invention need not provide dielectric barrier function, optimum utilization of conventional extrusion materials is enabled without respect to permittivity (dielectric constant). The structural carrier dielectric can be optimized for low cost, fabricability, mechanical and thermal properties. For example, cordierite, having a low dielectric constant of 5.3, may be used as a structural carrier material due to the excellent thermal shock capability of cordierite.

Further, as die present reactor capacitance is not dependent on the thickness of the structural carrier, structural carrier thickness may be determined based upon the mechanical strength and durability requirements of a given system.

The present invention advantageously provides a low-cost structural support enabling tailoring of the conductor and high k barrier layers for optimal electrical performance—i.e., the present invention enables conductor and high k barrier layers to be tailored as thin as possible for the particular application. The present invention advantageously provides a highly practical design providing high capacitance and thus high performance capability.

Advantageously, the present non-thermal plasma reactors are highly adaptable and may be provided in a variety of configurations, including stacked plates with discrete spacers, stacked shapes such as C-shapes, planar or swept-shaped elements, or inter-digitized elements prepared from comb-shaped connectors.

The present invention advantageously utilizes thin (conductive layers (such as, for example, layers of about 0.02 mm thick) for low inductance, maximum durability against thermal fatigue, and minimum cost. Structural conductor designs are more prone to thermal fatigue failure. The present reactors comprise thin high k dielectric barrier layers tailored to have dimensions as thin as possible for the particular NTP reactor application (e.g., about 0.25 mm thick for alumina) to maximize efficiency and power per unit are. A variety of material combinations may be selected in accordance with particular application requirements to achieve optimal corona discharge, such as, for example, a high k bismuth strontium titanate dielectric barrier layer over a silver electrode layer over a cordierite structural carrier base.

These and other features and advantages of the invention will be more fully understood from the following description of certain specific embodiments of the invention taken together with the accompanying drawings.

BRIEF DESCRIPTION OF THE DRAWINGS

Referring now to the drawings, which are meant to be exemplary, not limiting, and wherein like elements are numbered alike in the several Figures:

FIG. 12 is a view of a structural carrier inter-digitized tine end connector.

FIG. 13 is a view of a null dielectric barrier structural carrier end connector.

DESCRIPTION OF THE PREFERRED EMBODIMENT

Figure 1:
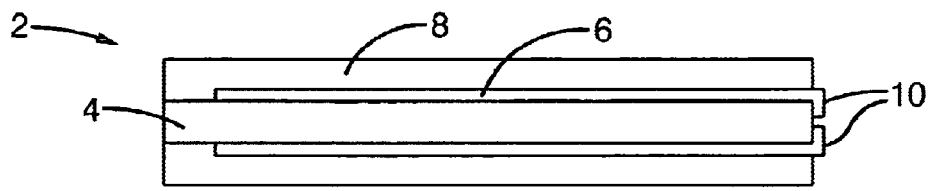
FIG. 1 shows a view of a double dielectric barrier structural carrier plate.

FIG. 1 shows a view of a double dielectric barrier structural carrier plate 2. The plate 2 includes a structural carrier base dielectric 4 having an electrode layer 6 disposed on opposite sides of the plate 2. A thin high k dielectric layer 8 is disposed on each of the electrode layers 6 and a bus connection 10 is provided on an end of the plate 2.

In a preferred embodiment, the structural carrier base 4 is constructed from a dielectric having good mechanical and thermal properties such as alumina, mullite, and cordierite, among others. The electrode layer 6 typically comprises a silver thick film composition. The high k dielectric layer 8 may be comprised from several materials, such as bismuth strontium titanate, bismuth titanate, bismuth niobium titanate, barium strontium titanate among others. The high k layer 8 is typically applied by dipping, spraying, metal oxide chemical vapor depositing, plating, printing, or other known methods.

Figure 2:
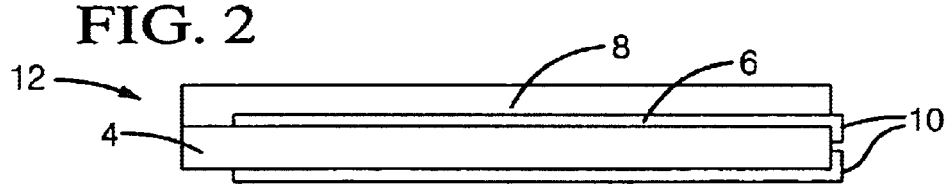
FIG. 2 shows a view of a single dielectric barrier structural carrier plate.

FIG. 2 shows a view of a single dielectric barrier structural carrier plate 12. The plate 12 includes a structural carrier base dielectric 4 having an electrode layer 6 disposed on opposite sides of the plate 12 and a bus connection 10 provided on an end of the plate 12. A thin high k dielectric layer 8 is disposed on one of the electrode layers 6.

Figure 3:
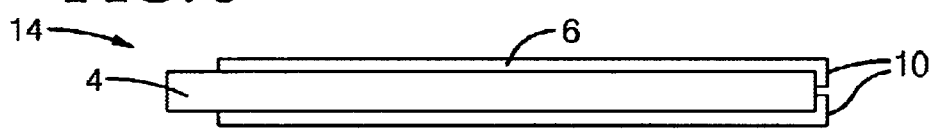
FIG. 3 shows a view of a null dielectric barrier structural carrier plate.

FIG. 3 shows a view of a null dielectric barrier structural carrier plate 14. The plate 14 includes a structural carrier base dielectric 4 having an electrode layer 6 disposed on opposite sides of the plate 14 and a bus connection 10 provided on an end of the plate 14.

Figure 4:
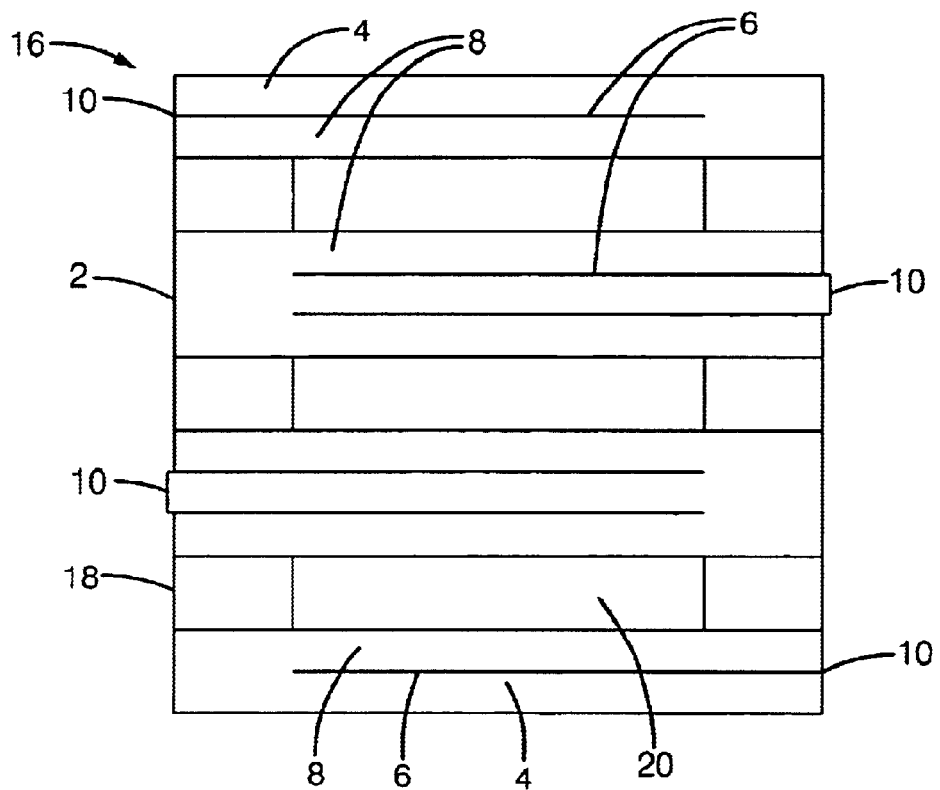
FIG. 4 shows a view of a double dielectric structural carrier element constructed from double dielectric barrier structural carrier plates with discrete spacers.

FIG. 4 shows a view of a double dielectric structural carrier element 16 constructed from double dielectric barrier structural carrier plates 2 and discrete spacers 18. A plurality of plates 2 are stacked having discrete spacers 18 disposed at opposite ends of the plates 2 forming exhaust passages between adjacent plates 2. Bus connections 10 are provided at alternating sides of the plates 2. An outside plate 22 including a structural base dielectric 4, an electrode layer 6, and a high k dielectric layer 8, caps each end of the element 16.

Figure 5:
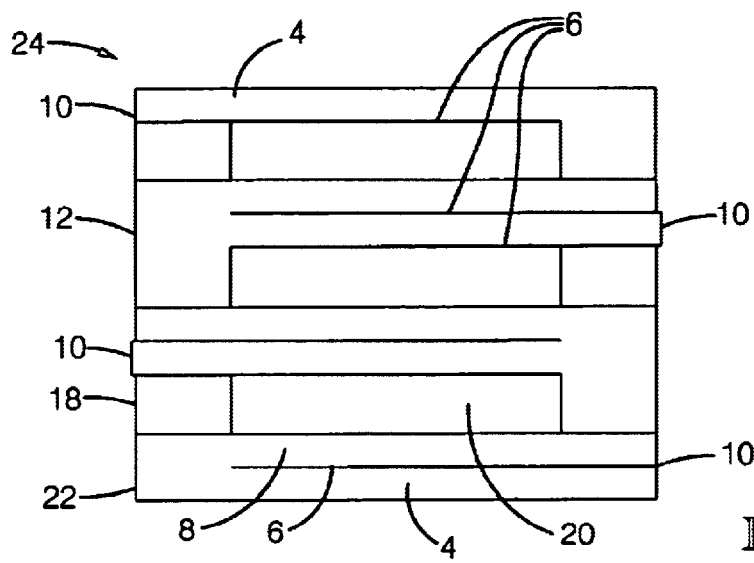
FIG. 5 shows a view of a single dielectric structural carrier element constructed from single dielectric barrier structural carrier plates with discrete spacers.

FIG. 5 shows a view of a single dielectric structural carrier element 24 constructed from single dielectric barrier structural carrier plates 12 and discrete spacers 18. A plurality of plates 12 are stacked having discrete spacers 18 disposed at opposite ends forming exhaust passages 20 between adjacent plates 12. Bus connections 10 are provided to alternating sides of the plates 12. An outside plate 22 including a structural base dielectric 4, an electrode layer 6, and a high k dielectric layer 8, caps a bottom end of the element (24). An outside plate 26 including a structural carrier base dielectric 4 and an electrode layer 6 caps a top end of the element 24.

Figure 5A:
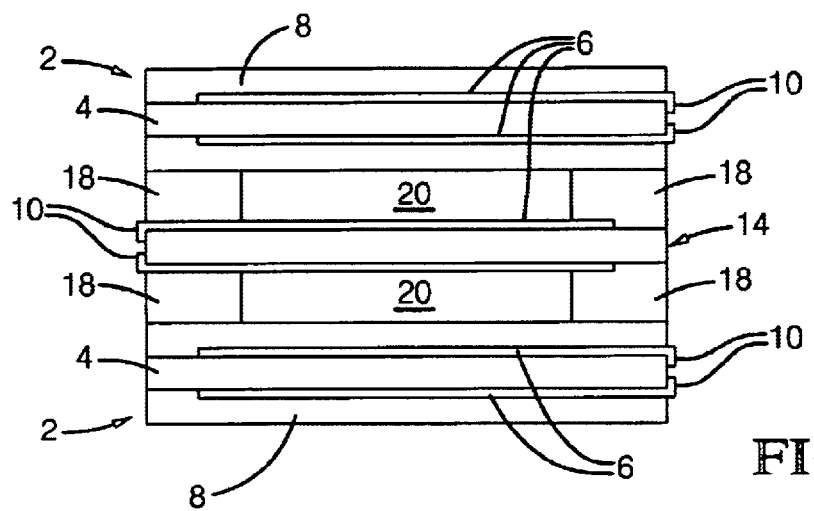
FIG. 5A shows a view of a single dielectric barrier structural carrier element constructed from double dielectric barrier structural carrier plates and null dielectric barrier structural carrier plates.

FIG. 5A shows a view of a single dielectric barrier structural carrier element 24 constructed from double dielectric barrier structural carrier plates 2, null dielectric barrier structural carrier plates 14, and discrete spacers 18. A plurality of plates 2, 14 are stacked having discrete spacers 18 disposed at opposite ends forming exhaust passages 20 between adjacent plates 2, 14. Bus connections 10 are provided to alternating sides of the plates 2, 14.

Figure 6:
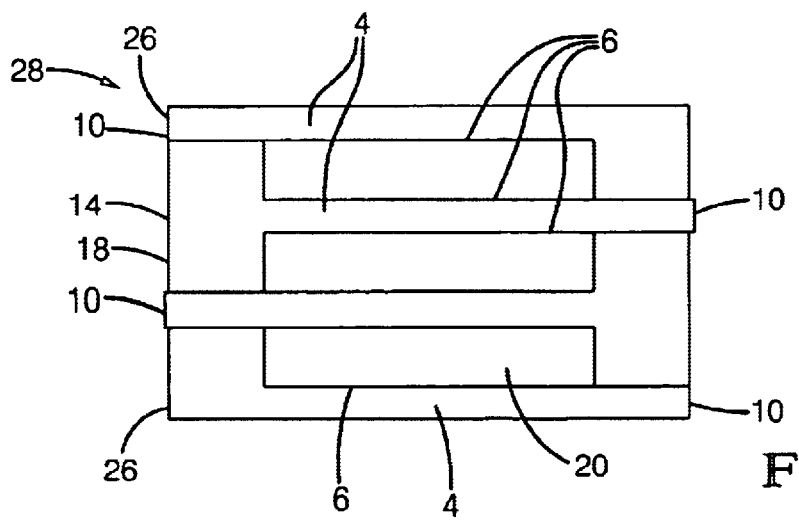
FIG. 6 shows a view of a null dielectric structural carrier element constructed from null dielectric barrier structural carrier plates with discrete spacers.

FIG. 6 shows a view of a null dielectric structural carrier element 28 constructed from null dielectric barrier structural carrier plates 14 with discrete spacers 18. A plurality of plates 14 are stacked having discrete spacers 18 disposed at opposite ends forming exhaust passages 20 between adjacent plates 18. Bus connections 10 are provided to alternating sides of the plates 14. An outside plate 26 including a structural carrier base dielectric 4 and an electrode layer 6 caps top and bottom ends of the element 28.

Figure 7:
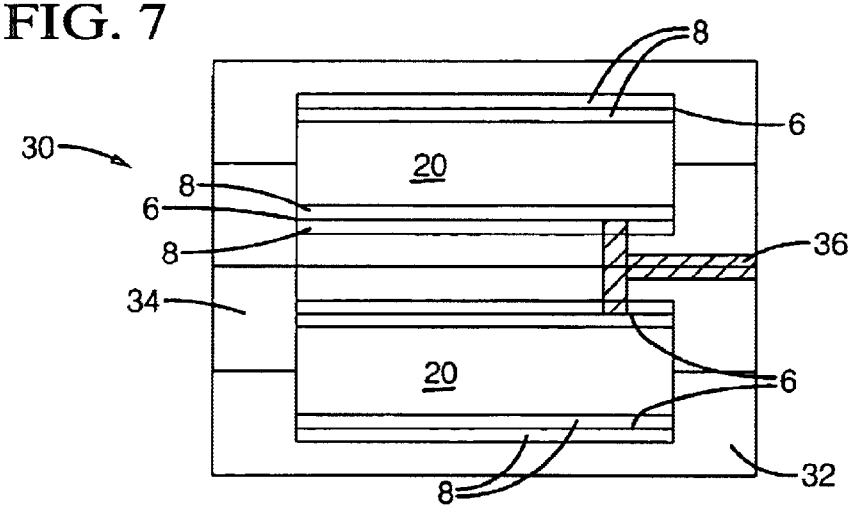
FIG. 7 shows a view of a double dielectric structural carrier element constructed from C-shapes prepared from C-shaped coated structural carriers.

FIG. 7 shows a view of a double dielectric structural carrier element 30 constructed from C-shapes 32 prepared from C-shaped coated structural carriers 34. The coated C-shaped structural carriers 34 include a structural carrier base dielectric 32 having an electrode layer 6 disposed on high k coated main central regions of the C-shape carriers 34 and a high k dielectric layer 8 disposed on each of the electrode layers 6. Optionally, bus connections are provided through side walls 36 or through the front face (not shown). A plurality of coated C-shaped structural carriers 34 are stacked forming exhaust passages 20.

In a preferred embodiment, the C-shaped structural carrier 34 is prepared from dielectric having good mechanical and thermal properties, including, but not limited to, cordierite, mullite, and alumina, among others.

The electrode layer 6 is disposed so as to substantially cover the main central region of the C-shaped structural carrier 34 with coverage ending a sufficient distance from the ends of the carrier 34 to prevent electrical leakage.

Bus paths transfer electrical energy through the side of the NTP stack into each electrode layer 6. In one embodiment of the present invention, the C-shaped carrier 34 is prepared by laminating electrode layers 6 and high k dielectric layers 8 to one another and to the structural carrier 34. In this embodiment, a conductive thick film print may be applied from the central region to the edge of the C-shaped structural carrier 34 prior to laminating to form the bus paths 10.

In an alternate embodiment, the C-shaped structural carrier 34 is prepared via extruding or grinding. In this embodiment, the electrode layers 6 and high k barrier layers 8 are applied to the extruded C-shaped structural carrier 34 with conductive print extending toward the front or back faces, for example, of the coated C-shaped structural carrier 34. A thick film conductive print, C-clips, or vias, are typically used to connect the electrode layers 6 on each side of individual high k barrier layers 8. This secondary bus path is extended from the front face to the side where additional cell connections to the main bus paths, power or ground are provided. Preferably, an insulating coating is provided over the bus path to prevent electrical leakage.

The high k barrier layer 8 may be applied over the electrode layer 6 using any suitable means including, but not limited to, spraying, stenciling, and other methods.

The high k barrier layer 8 may comprise any suitable material providing the desired combination of mechanical and electrical characteristics. Further, the high k barrier layer may be doped to impart or enhance desired properties. In a preferred embodiment, the high k barrier layer 8 comprises materials having less than about 5% porosity and an optimized combination of permittivity and mechanical strength characteristics. Suitable coatings for the high k barrier layer 8 include, but are not limited to, bismuth strontium titanate, bismuth titanate, barium strontium titanate, among others. The high k layer is typically applied by dipping, spraying, metal oxide chemical vapor depositing, plating, printing, or other known methods.

Figure 8:
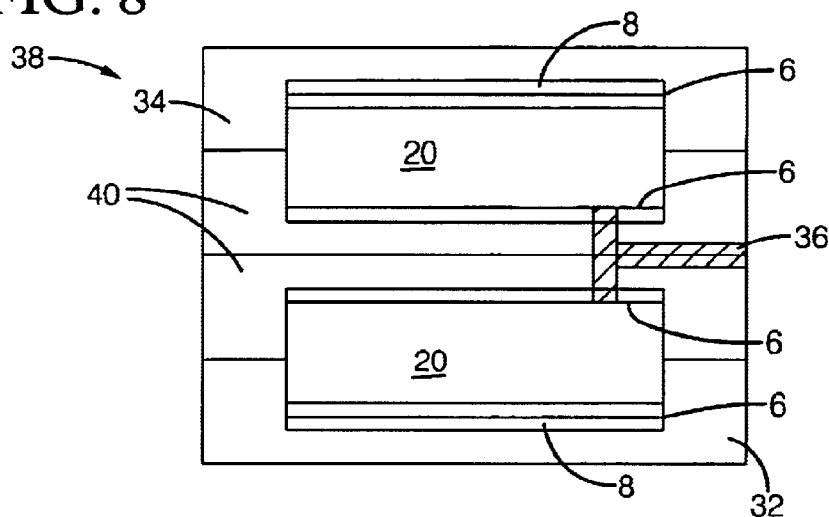
FIG. 8 shows a view of a single dielectric structural carrier element constructed from C-shapes prepared from C-shaped coated structural carriers and null dielectric barrier structural carriers.

FIG. 8 shows a view of a single dielectric structural carrier element 38 constructed from C-shapes 32 prepared from C-shaped coated structural carriers 34 and C-shaped null barrier structural carriers 40. A plurality of C-shaped coated structural carriers 34 and C-shaped null barrier structural carriers 40 are stacked forming exhaust passages 20. Optionally, bus connections 10 are provided through side walls 36 or through the front face (not shown).

Figure 9:
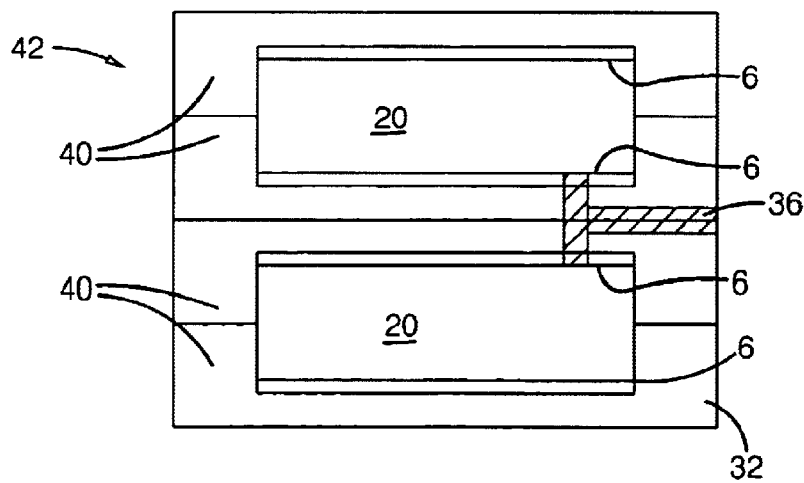
FIG. 9 shows a view of a null dielectric structural carrier element constructed from C-shapes prepared from C-shaped null dielectric barrier structural carriers.

FIG. 9 shows a view of a null dielectric structural carrier element 42 constructed from C-shapes 32 prepared from C-shaped null barrier structural carriers 40. A plurality of C-shaped null barrier structural carriers 40 are stacked forming exhaust passages 20. Optionally, bus connections 10 are provided through side walls 36 or through the front face (not shown).

Figure 10:
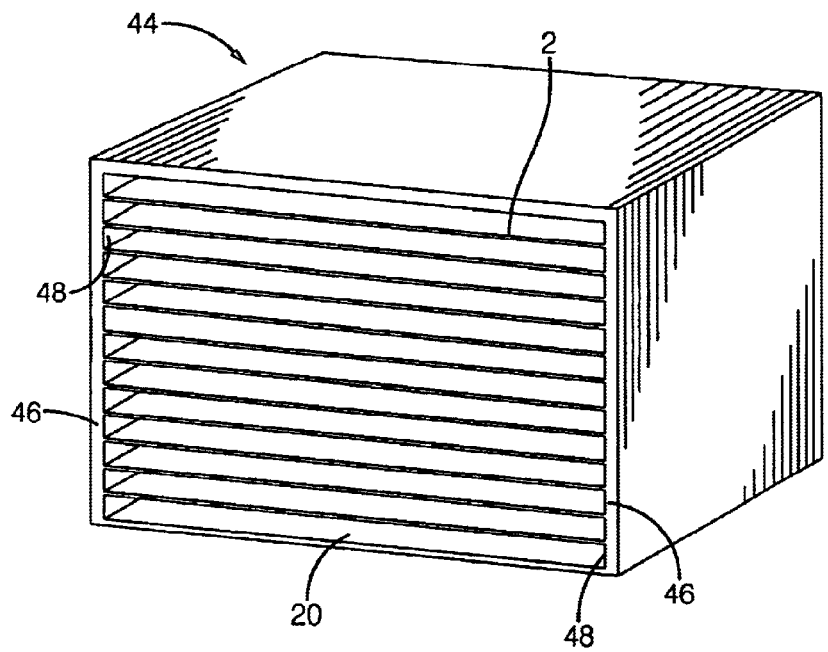
FIG. 10 shows a view of a double dielectric structural carrier element constructed from a planar extruded and coated structural carrier having few ligaments for improved efficiency.

FIG. 10 shows a view of a double dielectric structural carrier element 44 constructed from a planar extruded and coated double dielectric barrier structural carrier plate 2, the element 44 having few ligaments 46 (preferably the minimal number of ligaments possible while still providing suitable support) for improved efficiency. In this embodiment, the electrode layer 6 is typically applied to the structural carrier 4 by dipping the structural carrier 4 into a conductive dip coating, such as commercially available silver conductor dip coating E96928-13B available from E.I. Du Pont de Nemours & Co. Inc. The interior side walls 48 and any ligaments 46 are masked prior to coating to prevent formation of short paths. Alternatively, conductive coating can be removed from interior side walls 48 and any ligaments 46 after coating using solvent wipe prior to firing or other known methods. Bus paths (not shown) are connected using any method desired. Dip coating is also typically employed for applying the high k barrier layer 8 to the electrode layer 6.

Figure 11:
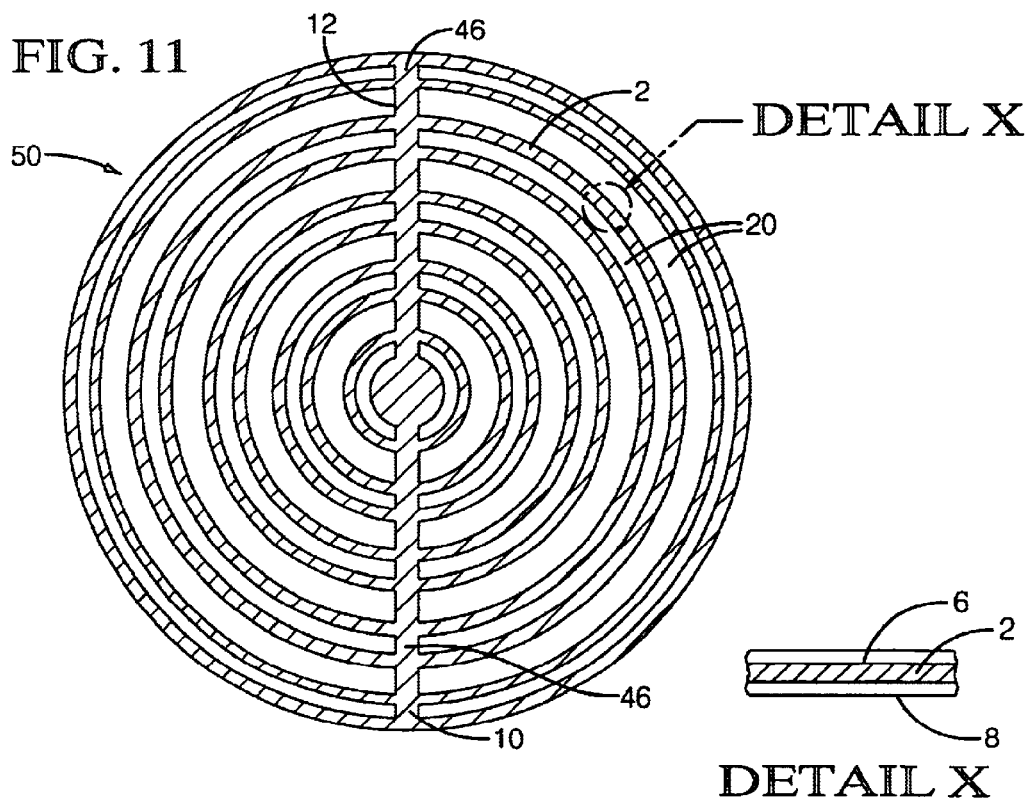
FIG. 11 shows a view of a double dielectric structural carrier element constructed from a swept-shaped extruded coated structural carrier having few ligaments for improved efficiency.

FIG. 11 shows a view of a double dielectric structural carrier element 50 Constructed from a swept-shaped extruded coated double dielectric barrier structural carrier 2 having few ligaments 46 for improved conversion efficiency. While the spacing is not shown true to form in FIG. 11, exhaust passages 20 are typically substantially evenly spaced in this embodiment. Electrode layer 6 is disposed on each side of opposite sides of swept-shaped structural carrier 50. A high k barrier layer 8 is disposed on each of the electrode layer 6. The electrode layers 6 and high k barrier layers 8 are typically applied using dip coating, although any desired method may be used to prepare the swept-shaped coated structural carrier 2. Preferably, the ligaments 46 are masked to prevent electrical shorting between paths. Alternatively, conductive coating may be removed from ligaments 46 after coating using solvent wipe or other known methods prior to fire. Bus paths 10 are typically located along each of the ligaments 46.

FIG. 12 is a view of a double dielectric barrier structural carrier inter-digitized tine end connector 52. Two structural carrier inter-digitized tine end connectors 52 are used to build a standard sized inter-digitized tine reactor element. One inter-digitized tine end connector 52 is inverted, inserted into a second oppositely oriented inter-digitized tine end connector 52, and secured, to make a double dielectric barrier structural inter-digitized tine reactor element (such as the double dielectric inter-digitized tine reactor element 32 shown in FIG. 14).

The structural carrier inter-digitized tine end connector 52 shape is constructed from a structural dielectric core 4 (shown in the enlarged detail Z of FIG. 12). The structural dielectric comprising core 4 may comprise any material having suitable dielectric properties, including, but not limited to, alumina, cordierite, mullite, or other structural dielectrics. In the tine 54 region, the structural dielectric core 4 is layered with electrode layer 6 and a high k layer 8. In the pocket 56 region and back plane region 58, the structural dielectric core 4 is initially uncoated. The electrode layers 6 are connected to the bus path 10 on the back plane 58 through bus connection paths 60. The grip-side 62 of the structural carrier inter-digitized tine end connector 52 is constructed of structural dielectric 4 with a layer of electrode 6 and a high-k dielectric layer 8 on the inside region. The outside of the grip-side 62 comprises uncoated structural dielectric 4.

The base structural carrier inter-digitized tine end connector 52 shape is typically formed by extrusion, although it may be formed by any suitable means. Pocket regions 56 are masked and the tine regions 52 are coated with electrode layers 6 using dipping, spraying, vaporizing, plating, or other methods. Bus connection paths 60 and bus paths 10 are also formed at this time using similar techniques known in the art. Dielectric 4 is then applied over all electrode regions using dipping, spraying, vaporizing, plating, laminating, or other known processes.

In an alternate embodiment, the structural carrier inter-digitized tine end connector 52 is constructed from sections. Tines 54 may be constructed from electrode coated and dielectric coated dielectric plates, by two electrode coated dielectric plates sandwiched together, or by an electrode-dielectric laminate. The coated plates are inserted into the pockets 56 of an edge connector and secured, such as with high-temperature capable adhesive. In this embodiment, the bus connecting paths 60 are formed directly on the tine plates 54 prior to assembly into the connector 52. The electrode layer 6 is set back a distance from the front and back regions of the tine plates 54, typically from about 2 to about 15 mm. This set back distance reduces the potential for charge leakage at the front or rear of the reactor and between alternate polarity plates in the assembled reactor during operation When assembled into the edge connector, the bus connection paths 60 fit inside the edge connector pockets 56 and run to the front (or rear) of the connector 52. The bus path 10 is formed at the front or rear of the element using thick film conductor composition and subsequently covered with dielectric encapsulent.

FIG. 13 is a view of a null dielectric barrier structural carrier inter-digitized tine end connector 64. The tine regions 54 comprise a structural ceramic core 4 having an electrode layer 6 disposed thereon. Except for the elimination of the dielectric layer 8 in the tine region 54, other details are the same as for structural carrier inter-digitized tine end connector 10 shown in FIG. 12.

Figure 14:
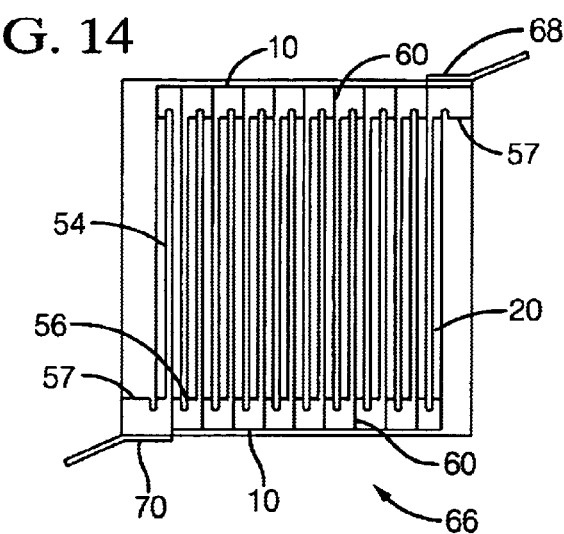
FIG. 14 is a view of a double dielectric barrier inter-digitized tine reactor element constructed from structural carrier inter-digitized tine end connectors.

FIG. 14 is a view of a double dielectric barrier inter-digitized reactor element 66 constructed from double dielectric structural carrier inter-digitized tine end connectors 52. The ends of the tines 54 fit into the retention pockets 56 until joint lines 57 are formed. The two end connectors 52 are joined at the joint lines 57 using ceramic cement, glass composition, or other known high temperature capable bonding methods. Optionally, the end connectors 52 may be joined at the outer wall of the element using adhesives, band clamps, or by applying mat pressure when packaged. Isolating spacers are not required between pairs of connectors 52. Exhaust gas flows through exhaust passages 20 during operation. The power connection to the element 66 is made at the power connect terminal 68. The ground connection to the element 66 is made at the ground connect terminal 70. To minimize electrical leakage, retention pockets 56 are typically not coated with electrode layer 6 material. Preferably, multiple bus path connections 10 are provided to optimize electrical continuity to each tine 54.

Figure 15:
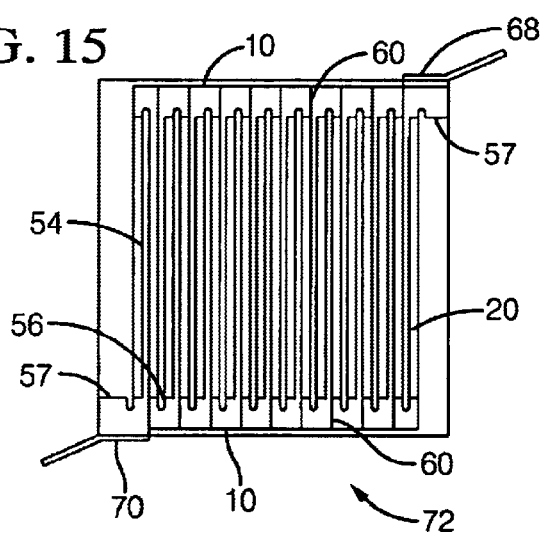
FIG. 15 is a view of a single dielectric barrier inter-digitized tine reactor element constructed from a structural carrier inter-digitized tine end connector and a null dielectric barrier structural carrier end connector.

FIG. 15 is a view of a single dielectric barrier inter-digitized reactor element 72 constructed from a double dielectric structural carrier inter-digitized tine end connector 52 and a null dielectric barrier structural carrier end connector 64. The ends of the tines 54 fit into the retention pockets 56 until joint lines 57 are formed. The two end connectors 52, 64 are joined at the joint lines 57 using ceramic cement, glass composition, or other known high temperature capable bonding method. Optionally, the end connectors 52, 64 may be joined at the outer wall of the element 72 using adhesives, band clamps, or by applying mat pressure when packaged. Exhaust gas flows through exhaust passages 20 during operation. The power connection to the element 72 is made at the power connect terminal 68. The ground connection to the element 72 is made at the ground connect terminal 70.

Figure 16:
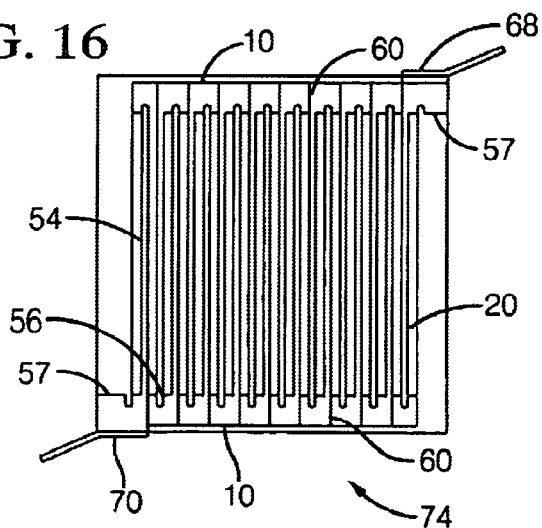
FIG. 16 is a view of a null dielectric barrier inter-digitized reactor element constructed from null dielectric barrier structural carrier inter-digitized tine end connectors.

FIG. 16 is a view of a null dielectric barrier inter-digitized reactor element 74 constructed from null dielectric barrier structural carrier inter-digitized tine end connectors 64. The ends of the tines 54 fit into the retention pockets 56 until joint lines 57 are formed. The two end connectors 64 are joined at the joint lines 57 using ceramic cement, glass composition, or other known high temperature capable bonding methods. Optionally, the end connectors 57 are joined at the outer wall of the element 74. Exhaust gas flows through exhaust passages 20 during operation. The power connection to the element 74 is made at the power connect terminal 68. The ground connection to the element 74 is made at the ground connect terminal 70.

It is contemplated that intermediate coatings such as glazes and the like may be disposed between the electrode layers 6 and the structural carrier base dielectric 4, if desired. A glaze is typically employed, for example, when the structural support carrier comprises a highly porous material. In such instances, the glaze is used to improve bonding of a thick film conductor to the structural carrier.

The present invention advantageously achieves high power per unit area and conversion efficiency using a thin, high k barrier layer. By using a thin electrode layer, the present invention further advantageously minimizes induction. The present structural carrier is relatively low cost and provides a durable structural base for the electrode and high k barrier layers. Thus, the present invention provides a highly durable NTP reactor element that can be manufactured at lower cost than previously available high performance high k barrier NTP reactors.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

What is claimed is:

1. A structural carrier non-thermal plasma reactor element comprising:

at least one structural carrier, said structural carrier being selected from the group consisting of null dielectric barrier structural carriers, single dielectric barrier structural carriers; and double dielectric barrier structural carriers;

wherein said null dielectric barrier structural carriers comprise;
      a structural carrier for providing structural support;
      a first electrode layer disposed upon a first side of said structural carrier; and
      a second electrode layer disposed upon a second side of said structural carrier;

wherein said single dielectric barrier structural carriers comprise:
      a structural carrier for providing structural support;
      a first electrode layer disposed upon a first side of said structural carrier;
      a second electrode layer disposed upon a second side of said structural carrier; and
      a first thin high k dielectric barrier layer disposed upon said first electrode layer for providing dielectric barrier function; and wherein said double dielectric barrier structural carriers comprise:
      a structural carrier for providing structural support;
      a first electrode layer disposed upon a first side of said structural carrier;
      a second electrode layer disposed upon a second side of said structural carrier;
      a first thin high k dielectric barrier layer disposed upon said first electrode layer for providing dielectric barrier function; and a second thin high k dielectric barrier layer disposed upon said second electrode layer for providing dielectric barrier function.

2. The structural carrier non-thermal plasma reactor element of claim 1, wherein said structural carriers comprise plate-shaped structural carriers.

3. The structural carrier non-thermal plasma reactor element of claim 1, wherein said structural carriers comprise C-shaped structural carriers.

4. The structural carrier non-thermal plasma reactor element of claim 1, wherein said structural carriers comprise tine end connectors.

5. The structural carrier non-thermal plasma reactor element of claim 4, further comprising:

a plurality of inter-digitized tine end connectors, each tine end connector having a bus connection path formed thereon.

6. The structural carrier non-thermal plasma reactor element of claim 1, wherein said structural carrier comprises a swept shaped structural carrier.

7. The structural carrier non-thermal plasma reactor element of claim 6, wherein said swept shaped structural carrier comprises a double dielectric barrier extruded swept shaped structural carrier having minimal structural ligaments.

8. The structural carrier non-thermal plasma reactor element of claim 1, wherein said structural carrier element comprises a double dielectric barrier planar extruded structural carrier element having minimal structural ligaments.

9. The structural carrier non-thermal plasma reactor element of claim 1, wherein said structural carrier is prepared from a dielectric material having properties sufficient to provide a suitable combination of low cost, fabricability, mechanical strength and thermal properties.

10. The structural carrier non-thermal plasma reactor element of claim 1, wherein said structural carrier comprises cordierite, mullite, or alumina.

11. The structural carrier non-thermal plasma reactor element of claim 1, wherein said first thin high k barrier layer and, if present, said second thin high k barrier layer comprise a high k material having less than about 5% porosity.

12. The structural carrier non-thermal plasma reactor element of claim 1, wherein said first thin high k barrier layer and, if present, said second thin high k barrier layer comprise a material selected from the group consisting of bismuth strontium titanate, bismuth titanate, bismuth niobium titanate, or barium strontium titanate.

13. The structural carrier non-thermal plasma reactor element of claim 1, wherein said one or a combination of said first thin high k barrier layer and said second thin high k barrier layer is doped.

14. The structural carrier non-thermal plasma reactor element of claim 1, wherein said structural carrier non-thermal plasma reactor element is a double dielectric barrier structural carrier element comprising:

a first double dielectric barrier structural carrier;

a second double dielectric barrier structural carrier; and spacers arranged to provide an exhaust gas passage between said first and second double dielectric barrier structural carriers.

15. The structural carrier non-thermal plasma reactor element of claim 1, wherein said structural carrier non-thermal plasma reactor element is a single dielectric barrier structural carrier element comprising:

a first single dielectric barrier structural carrier;

a second single dielectric barrier structural carrier; and spacers arranged to provide an exhaust gas passage between said first and second single dielectric barrier structural carriers.

16. The structural carrier non-thermal plasma reactor element of claim 1, wherein said structural carrier non-thermal plasma reactor element is a single dielectric barrier structural carrier element comprising:

a double dielectric barrier structural carrier;

a null dielectric barrier structural carrier; and spacers arranged to provide an exhaust gas passage between said double dielectric barrier structural carrier and said null dielectric barrier structural carrier.

17. The structural carrier non-thermal plasma reactor element of claim 1, wherein said structural carrier non-thermal plasma reactor element is a null dielectric barrier structural carrier element comprising:

a first null dielectric barrier structural carrier;

a second null dielectric barrier structural carrier; and spacers arranged to provide an exhaust gas passage between said first and second null dielectric barrier structural carriers.

18. The structural carrier non-thermal plasma reactor element of claim 1, wherein said structural carrier non-thermal plasma reactor element is a C-shaped double dielectric barrier structural carrier element comprising:

a first C-shaped double dielectric barrier structural carrier;

a second C-shaped double dielectric barrier structural carrier;

wherein said first and second C-shaped double dielectric barrier structural carriers are arranged to provide a C-shaped double dielectric barrier structural carrier element including an exhaust gas passage formed between said first and second C-shaped double dielectric barrier structural carriers.

19. The structural carrier non-thermal plasma reactor element of claim 1, wherein said structural carrier non-thermal plasma reactor element is a C-shaped single dielectric barrier structural carrier element comprising:

a C-shaped double dielectric barrier structural carrier;

a C-shaped null dielectric barrier structural carrier;

wherein said C-shaped double dielectric barrier structural carrier and said C-shaped null dielectric barrier structural carrier are arranged to provide a C-shaped single dielectric barrier structural carrier element including an exhaust gas passage formed between said C-shaped double and C-shaped null dielectric barrier structural carriers.

20. The structural carrier non-thermal plasma reactor element of claim 1, wherein said structural carrier non-thermal plasma reactor element is a C-shaped null dielectric barrier structural carrier element comprising:

a first C-shaped hull dielectric barrier structural carrier;

a second C-shaped null dielectric barrier structural carrier;

wherein said first and second C-shaped null dielectric barrier structural carriers arm arranged to provide a C-shaped null dielectric barrier structural carrier element including an exhaust gas passage formed between said first and second C-shaped null dielectric barrier structural carriers.

21. The structural carrier non-thermal plasma reactor element of claim 1, wherein said structural carrier non-thermal plasma reactor element is a double dielectric barrier inter-digitized tine structural carrier element comprising:

a first double dielectric barrier tine end connector structural carrier; and a second double dielectric barrier tine end connector structural carrier;

wherein said first and second double dielectric barrier tine end connector structural carriers are combined to provide a double dielectric barrier inter-digitized tine structural carrier element.

22. The structural carrier non-thermal plasma reactor element of claim 1, wherein said structural carrier non-thermal plasma reactor element is a single dielectric barrier inter-digitized tine structural carrier element comprising:

a double dielectric barrier tine end connector structural carrier; and a null double dielectric barrier tine end connector structural carrier;

wherein said double and null dielectric barrier tine end connector structural carriers are combined to provide a single dielectric barrier inter-digitized tine structural carrier element.

23. The structural carrier non-thermal plasma reactor element of claim 1, wherein said structural carrier non-thermal plasma reactor element is a null dielectric barrier inter-digitized tine structural carrier element comprising:

a first null dielectric barrier tine end connector structural carrier; and a second null dielectric barrier tine end connector structural carrier;

wherein said first and second null dielectric barrier tine end connector structural carriers are combined to provide a null dielectric barrier inter-digitized tine structural carrier element.

* * * * *